(12) United States Patent
Takahashi et al.

(10) Patent No.: US 12,741,300 B2
(45) Date of Patent: Sep. 22, 2026

(54) DETOXIFICATION DEVICE AND NOZZLE SCRAPER

(71) Applicant: Edwards Japan Limited, Yachiyo (JP)

(72) Inventors: Katsunori Takahashi, Yachiyo (JP); Masahiro Tanaka, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 301 days.

(21) Appl. No.: 18/688,723

(22) PCT Filed: Sep. 21, 2022

(86) PCT No.: PCT/JP2022/035250
§ 371 (c)(1),
(2) Date: Mar. 1, 2024

(87) PCT Pub. No.: WO2023/054132
PCT Pub. Date: Apr. 6, 2023

(65) Prior Publication Data

US 2024/0375158 A1 Nov. 14, 2024

(30) Foreign Application Priority Data

Sep. 28, 2021 (JP) ................................ 2021-158263

(51) Int. Cl.

| | |
|---|---|
| ***B08B 9/043*** | (2006.01) |
| ***B08B 1/16*** | (2024.01) |
| ***B08B 1/30*** | (2024.01) |
| ***B08B 1/54*** | (2024.01) |
| ***B08B 13/00*** | (2006.01) |
| *H10P 72/00* | (2026.01) |

(52) U.S. Cl.
CPC ............ *B08B 9/0436* (2013.01); *B08B 1/165* (2024.01); *B08B 1/30* (2024.01); *B08B 1/54* (2024.01); *B08B 13/00* (2013.01); *B08B 2209/04* (2013.01); *H10P 72/0402* (2026.01)

(58) Field of Classification Search
CPC ............ F23D 14/68; F23D 14/50; F23G 7/06
See application file for complete search history.

(56) References Cited

U.S. PATENT DOCUMENTS

| | | |
|---|---|---|
| 5,832,843 A | 11/1998 | Park et al. |
| 10,018,354 B2 | 7/2018 | Seeley |
| 2015/0176838 A1 | 6/2015 | Seeley |
| 2019/0285272 A1 | 9/2019 | Benzeval |

FOREIGN PATENT DOCUMENTS

| | | |
|---|---|---|
| EP | 2463579 B1 | 4/2019 |
| GB | 2540552 A | 1/2017 |
| JP | 2009204289 A | 9/2009 |

(Continued)

OTHER PUBLICATIONS

Extended Search Report from counterpart European Application No. 22875999.9 dated Oct. 31, 2025, 8 pp.

(Continued)

*Primary Examiner* — Shay Karls
(74) *Attorney, Agent, or Firm* — Shumaker & Sieffert, P.A.

(57) ABSTRACT

A detoxifying device of a structure wherein the deposits can be removed cleanly, without leaving residue, even for a nozzle that is provided with a narrow diameter portion and a wide diameter portion that is further to the downstream side than the narrow diameter portion, and to provide a nozzle scraper used in said detoxifying device.

5 Claims, 6 Drawing Sheets

(56) References Cited

FOREIGN PATENT DOCUMENTS

| | | | |
|---|---|---|---|
| JP | 2015053319 | A | 3/2015 |
| JP | 2015528096 | A | 9/2015 |
| JP | 2019520539 | A | 7/2019 |
| JP | 6777472 | B2 | 10/2020 |

OTHER PUBLICATIONS

International Search Report and Written Opinion of International Application No. PCT/JP2022/035250, dated Nov. 29, 2022, 10 Pages.

(a)

(b)

(a)

(b)

DETOXIFICATION DEVICE AND NOZZLE SCRAPER

This application is a U.S. national phase application under 35 U.S.C. § 371 of international application number PCT/JP2022/035250 filed on Sep. 21, 2022, which claims the benefit of JP application number 2021-158263 filed on Sep. 28, 2021. The entire contents of each of international application number PCT/JP2022/035250 and JP application number 2021-158263 are incorporated herein by reference.

TECHNICAL FIELD

The present disclosure relates to a detoxifying device and a nozzle scraper, and, in particular, to a detoxifying device for detoxifying, through combustion or thermal decomposition in a combustion chamber, toxic components in a process gas, and relates to a nozzle scraper for removing deposits that adhere to the periphery of the combustion chamber.

BACKGROUND

Conventionally in semiconductor manufacturing plants, for example, combustion-type detoxifying devices have been used as means for detoxifying exhaust gases that include toxic components, exhausted from processing chambers in semiconductor manufacturing equipment.

In some examples of detoxifying device devices for semiconductor manufacturing equipment, a process gas (exhaust gas) that includes a toxic component is combusted in a combustion chamber to cause a reaction with air (oxygen) to convert into a non-toxic gas. However, if in a case such as the process gas being silane gas ($SiH_4$), for example, the result of the oxidation reaction is the production of non-toxic silicon dioxide silica ($SiO_2$). This silica is a solid powder, where energy is applied when converting into silica through the oxidation reaction, scattering the silica into the space within the combustion chamber, which is the space wherein the oxidation reaction takes place. That is, it (the silica) scatters, rather than dropping downward directly, so most of it adheres within the nozzle that introduces the gas into the treatment chamber, and adheres to the surroundings thereof, producing a deposit as time elapses. This makes it necessary to carry out periodic maintenance (overhauling) to remove those deposits. Maintenance to mechanically remove the deposits that are adhered on the inner wall surfaces of the combustion chamber and the deposits that are adhered to the wall surfaces in the process gas passage generally are carried out at a frequency of about once every three months. Consequently, from the perspectives of operations and cost, it is best if the maintenance time required for each maintenance is short.

Given this, conventionally the removal devices described and have been known as technologies for mechanical removal of deposits that have been deposited in the vicinity of the gas introducing aperture outlet for introducing the process gas into the combustion chamber.

An example scraper that has an L-shaped scraping head that can be folded back is provided in the passage for the process gas. In addition, the tip end portion of the scraping head is configured so as to expand into an L-shape in the combustion chamber when inserted into the space within the combustion chamber. Given this, once the tip end portion of the scraping head has spread out within the combustion chamber, and the scraper in this spread state is rotated together with the tip end portion, the deposits that are adhered to the inner wall surface around the opening of the combustion chamber, and the deposits adhered to the wall surfaces within the passage for the process gas can be removed mechanically. However, with the configuration, if one wished to provide a temperature sensor in a structure that protrudes from the inner wall surface of the combustion chamber, the temperature sensor would interfere with the rotation of the scraping head.

In other examples, a structure that enables mechanical removal of deposits that are adhered to the inner wall surfaces of the combustion chamber while the scraping head is rotated avoiding the temperature sensor. However, while a configuration that removes mechanically deposits that are adhered to the inner wall surfaces of the combustion chamber, there is no disclosure of a structure that simultaneously removes also deposits that are adhered to the wall surfaces within the process gas passage.

In addition, the gas introducing tube (nozzle) for introducing the process gas into the combustion chamber does not necessarily have a circular cross section, and there are also cases wherein orifices, Venturi tubes, and the like, are used that have rectangular, substantially square, or elliptical cross sections, and that have narrow diameter portions and wide diameter portions that are provided further to the downstream side than the narrow diameter portions.

SUMMARY

However, when, for example, an orifice, a Venturi tube, or the like, wherein the cross section is not circular, but rather the cross section is rectangular, substantially square, or elliptical, and that is equipped with a narrow diameter portion with a wide diameter portion further to the downstream side than the narrow diameter portion, is used as the gas introducing tube (nozzle) for introducing into the process gas into the combustion chamber, there is a problem in that scraping residue will be produced when removing the deposits that are adhered to the inner wall of the wide diameter portion.

This produces a technological issue that requires resolution to provide a detoxifying device of a structure wherein the deposits can be removed cleanly, without leaving residue, even for, for example, a nozzle that is provided with a narrow diameter portion and a wide diameter portion that is further to the downstream side than the narrow diameter portion.

The present disclosure was proposed in order to achieve the object set forth above, where the disclosure provides a detoxifying device for detoxifying, through combustion or thermal decomposition within a combustion chamber, a process gas that includes a toxic component, comprising: a nozzle that comprises a narrow diameter portion and a wide diameter portion that is provided further to the downstream side than the narrow diameter portion, said nozzle connected to the top face of the combustion chamber, for introducing the process gas into the combustion chamber; a nozzle scraper that is able to move upward and downward within a prescribed movement range within the wide diameter portion, to remove deposits adhered within the wide diameter portion; and a head scraper for removing the deposits that are adhered to a lower portion of the nozzle scraper, at the bottommost position of the range of movement thereof, wherein: the nozzle scraper has a scraping portion for removing the deposits that are adhered to the inner wall of the wide diameter portion, and a protruding portion that is provided at the bottom end of the narrow diameter portion at the topmost position of the movement range.

Given this structure, the deposits that are adhered to the inner peripheral wall and the top face of the nozzle are removed and expelled into the combustion chamber, through the nozzle scraper that moves up and down within the wide diameter portion that is provided further to the downstream side than the narrow diameter portion. That is, the deposits that are adhered to the inner peripheral surface of the wide diameter portion are scraped off, and expelled into the combustion chamber, by the scraping portion of the nozzle scraper, and the deposits that are adhered to the top face wall of the wide diameter portion are expelled into the combustion chamber by the protruding portion of the nozzle scraper. Additionally, the deposits that are adhered to the lower portion of the nozzle scraper are removed by the head scraper at the bottommost portion of the range of movement of the nozzle scraper. Through this, the deposits that are deposited on the inner peripheral wall and the top face wall of the wide diameter portion that is provided further to the downstream side than the narrow diameter portion of the nozzle are all processed by being expelled into the combustion chamber by the nozzle scraper. Moreover, deposits that adhere at the lower portion of the nozzle scraper can also be processed by being expelled into the combustion chamber by the head scraper at the bottommost position. Consequently, all deposits that are adhered, from the combustion chamber side to the inner peripheral wall and the top face wall of the wide diameter portion of the nozzle, are processed through being expelled by the nozzle scraper into the combustion chamber.

Moreover, because the movement of the nozzle scraper is up/down movement, this enables a process wherein the deposits in the wide diameter portion are expelled smoothly, even if the cross-sectional shape of the wide diameter portion is not limited to being circular, but rather the cross section is rectangular, substantially square, elliptical, or the like. Moreover, because the nozzle scraper moves up and down within the wide diameter portion that is provided further toward the downstream side than the narrow diameter portion, this enables application to also nozzles that use orifices, Venturi tubes, or the like, of a shape that is provided with a narrow diameter portion and a wide diameter portion that is further to the downstream side than the narrow diameter portion.

The disclosure provides a detoxifying device wherein, a portion of the protruding portion covers the bottom face of the narrow diameter portion in the standby position wherein the nozzle scraper is stopped.

Given this configuration, when the nozzle scraper is in the standby position, a portion of the protruding portion of the nozzle scraper covers the bottom face of the narrow diameter portion of the nozzle, so when the operation for scraping off the deposits is started from the standby position, the deposits adhered to the top face wall of the wide diameter portion, including also the location of the bottom face of the narrow diameter portion, can be expelled into the combustion chamber in a single operation.

The disclosure provides a detoxifying device wherein, the head scraper is structured from a plate-shaped member, and is provided so as to enable horizontal rotation, facing the top face within the combustion chamber.

This structure enables smooth removal through the head scraper scraping off, and expelling into the combustion chamber, the deposits that remain on the nozzle scraper, when the head scraper, which is a plate-shaped member, is rotated horizontally when moved to the bottommost position.

This configuration enables deposits to be removed smoothly through controlling, by a controlling portion in accordance with a predetermined process, driving of the nozzle scraper and the head scraper.

The disclosure provides a detoxifying device, wherein the controlling portion drives the head scraper to remove the deposits that are adhered to a lower portion of the nozzle scraper when the nozzle scraper is at the bottommost position of the movement range.

This structure enables smooth removal of deposits adhered to the lower portion of the nozzle scraper, through driving the head scraper, through control by the controlling portion, so that the head scraper will remove the deposits adhered to the lower portion of the nozzle scraper, when the nozzle scraper is at the bottommost portion of the movement range.

The disclosure provides a nozzle scraper used in a detoxifying device for detoxifying, through combustion or thermal decomposition of process gas in a combustion chamber, comprising: a nozzle, which comprises a narrow diameter portion and a wide diameter portion that is provided further to the downstream side than the narrow diameter portion, said nozzle connected to the top face of the combustion chamber, for introducing, into the combustion chamber, a gas to be treated that includes a toxic component, wherein said nozzle scraper comprises: a scraping portion for removing deposits that are adhered to an inner wall of the wide diameter portion; and a protruding portion, provided at the bottom end of the narrow diameter portion, at the topmost position of the movement range.

This configuration enables the deposits that are adhered to the inner wall surface of the nozzle in the detoxifying device for introducing the process gas into the combustion chamber to be scraped off and removed easily, and in a short time, through the use of this nozzle scraper in a detoxifying device.

Given the present disclosure, deposits that are deposited on the inner peripheral wall and the top face wall of the nozzle can be removed through the up/down movement of the nozzle scraper that moves up and down within the wide diameter portion that is provided further to the downstream side than the narrow diameter portion, the deposits adhered to the inner peripheral surface of the wide diameter portion that can be scraped off, and expelled into the combustion chamber, by the scraping portion of the nozzle scraper, the deposits adhered to the top face wall of the wide diameter portion can be expelled into the combustion chamber by the protruding portion of the nozzle scraper, and the deposits adhered to the lower portion of the nozzle scraper can be removed by the head scraper at the bottommost position of the movement range of the nozzle scraper. Through this, all of the deposits adhered to the top face wall and the inner peripheral wall of the wide diameter portion, which is provided further to the downstream side than the narrow diameter portion, of the nozzle can be treated by being expelled by the nozzle scraper into the combustion chamber. Additionally, the deposits adhered to the lower portion of the nozzle scraper can also be processed by being expelled, by the head scraper, into the combustion chamber.

Moreover, because the movement of the nozzle scraper is an up/down movement, this enables a process wherein the deposits in the wide diameter portion are expelled smoothly, even if the cross-sectional shape of the wide diameter portion is not limited to being circular, but rather the cross section is rectangular, substantially square, elliptical, or the like. Furthermore, because the configuration is such that the nozzle scraper moves up and down within the wide diameter portion that is provided further to the downstream side than the narrow diameter portion, this can be applied also to a nozzle that uses, for example, an orifice or a Venturi tube, or the like, that has a shape that is provided with a narrow diameter portion and a wide diameter portion that is further to the downstream side than the narrow diameter portion. This can be anticipated to improve productivity through achieving a reduction in the maintenance time.

DETAILED DESCRIPTION

Figure 1:
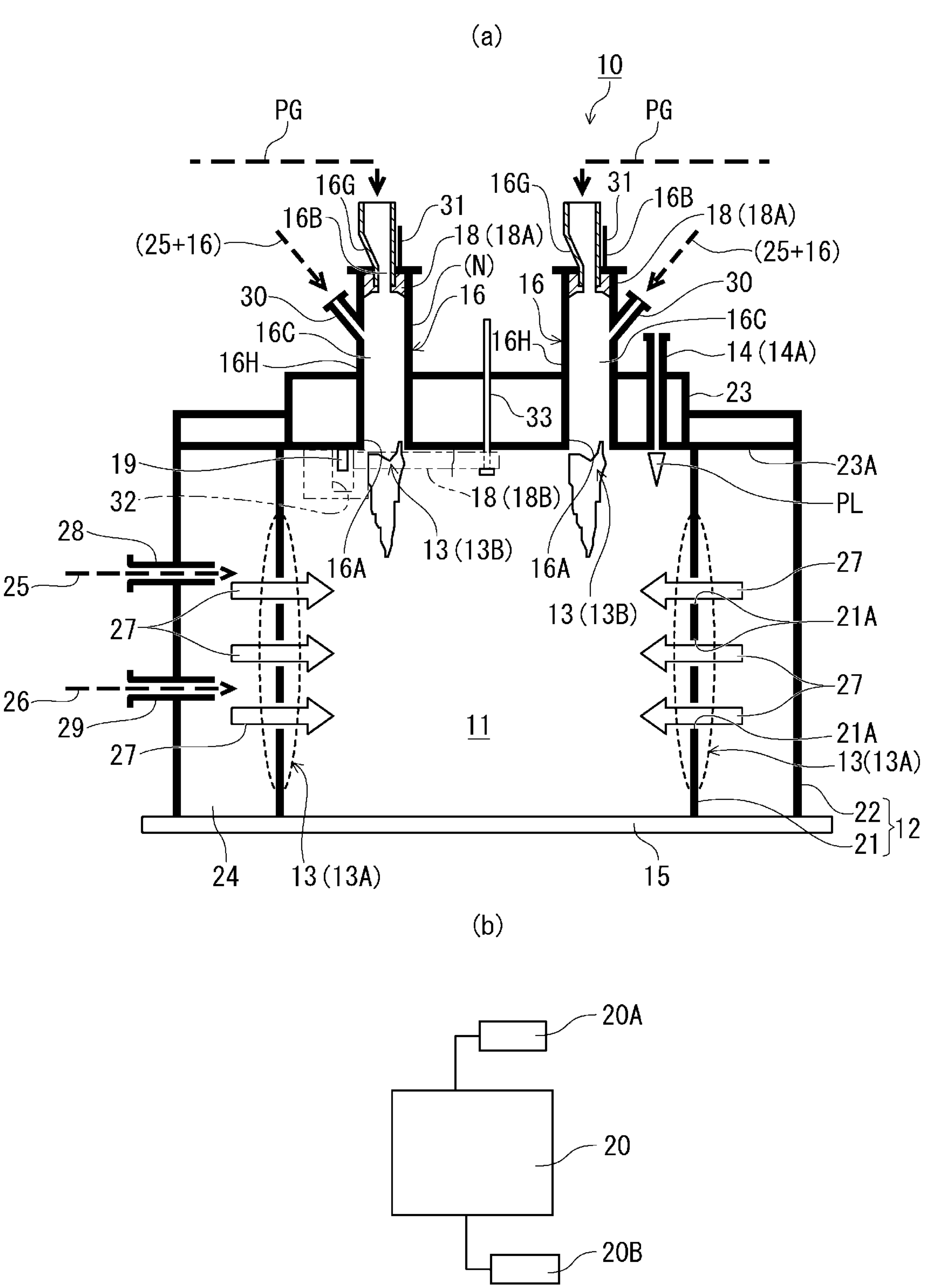
FIG. 1 is a schematic diagram of a detoxifying device depicted as an example according to the present disclosure, wherein (a) is a diagram depicting the structure of the mechanism portion thereof, and (b) is a block configuration diagram depicting the functions of the controlling portion thereof.

In order to achieve the object of providing a detoxifying device structured so as to enable deposits to be scraped off cleanly, without leaving a scraping residue, even for a nozzle that is provided with a narrow diameter portion and a wide diameter portion that is further to the downstream side than the narrow diameter portion, the present disclosure is achieved through a structure that is a detoxifying device for detoxifying, through combustion or thermal decomposition within a combustion chamber, a process gas that includes a toxic component, comprising: a nozzle that comprises a narrow diameter portion and a wide diameter portion that is provided further to the downstream side than the narrow diameter portion, said nozzle connected to the top face of the combustion chamber, for introducing the process gas into the combustion chamber; a nozzle scraper that is able to move upward and downward within a prescribed movement range within the wide diameter portion, to remove deposits adhered within the wide diameter portion; and a head scraper for removing the deposits that are adhered to a lower portion of the nozzle scraper, at the bottommost position of the range of movement thereof, wherein: the nozzle scraper has a scraping portion for removing the deposits that are adhered to the inner wall of the wide diameter portion, and a protruding portion that is provided at the bottom end of the narrow diameter portion at the topmost position of the movement range.

One example according to the present disclosure will be explained in detail based on the appended drawings. Note that when, in the example described below, there are references to numbers of structural elements, numeric values, quantities, ranges, or the like, there are no limitations to these specific numbers, and the values may be higher or lower, except if explicitly indicated and there is a clear limitation to the specific value by principle.

Moreover, when there is a reference to a shape or positional relationship for a structural element, this also includes any shapes, or the like, that substantially approximate or are analogous to that shape, except for when explicitly indicated and, for example, cases where it is clear from the principle that this is not the case.

Moreover, the drawings may enlarge or otherwise exaggerate the portions that are distinctive features, for ease in understanding the distinctive features, and the dimensional proportions, and the like, of structural elements are not necessarily the same as those in practice. Additionally, in cross-sectional drawings, hatching may be omitted for portions of structural elements for ease in understanding the cross-sectional structures of the structural elements.

Additionally, in the explanation below, expressions that indicate directions, such as up/down or left/right, are not absolute, and, although appropriate for the case of the orientation with which the various portions of the detoxifying device according to the present disclosure have been drawn, if there is a change in orientation, the interpretations thereof must change depending on the change in orientation. Throughout the explanations of the examples as a whole, identical reference symbols will be applied to identical elements.

Figure 2:
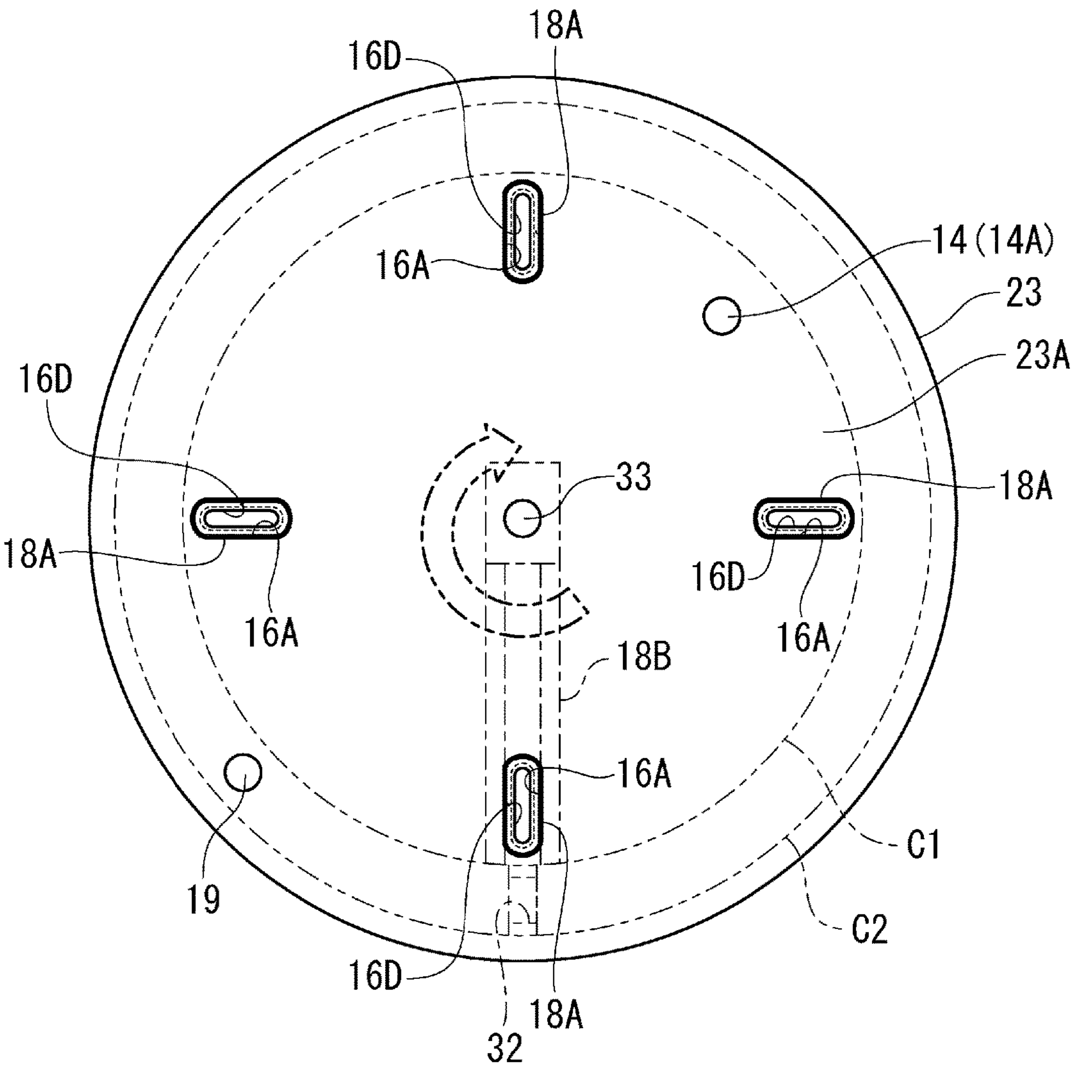
FIG. 2 is a plan view, viewed from the combustion chamber side, of the inlet head, and the surrounding structure thereof, in the aforementioned detoxifying device.

FIG. 1 is a schematic diagram of a detoxifying device 10 according to an example according to the present disclosure, wherein (a) is a diagram depicting the structure of the mechanism portion thereof, and (b) is a block diagram depicting the functions of the controlling portion thereof. FIG. 2 is a plan view, viewed from the combustion chamber 11 side, of the inlet head 23, and the surrounding structure, in the detoxifying device 10 depicted in FIG. 1. The detoxifying device 10 depicted in FIG. 1 and FIG. 2 is a combustion-type detoxifying device, used as means for detoxifying, through combustion or thermal decomposition, a gas that is to be detoxified, that is, as a process gas PG that is an exhaust gas that includes toxic components exhausted from a processing chamber of a well-known semiconductor manufacture equipment, or used as means to similarly detoxify, with an exhaust gas that includes a toxic component that is exhausted from equipment other than semiconductor manufacturing equipment as the process gas PG.

When the process gas PG that is exhausted from the processing chamber of the semiconductor manufacturing equipment is decomposed through combustion, powder is produced as microparticulate dust. For example, when silane gas ($SiH_4$) or dichlorosilane ($SiH_2C_{12}$) is decomposed through combustion, silicon dioxide, silica ($SiO_2$), is produced, or when tungsten tetraflouride ($WF_6$) is decomposed through combustion, tungsten oxide ($W2O_3$) is produced. Given this, these powders are deposited by adhering on the wall faces of the gas introducing aperture outlet 16A of the process gas nozzle 16, which is the gas passage for the process gas, described below, or on the wall face of the base portion 23A of the inlet head 23 of the combustion chamber 11 (the top face of the combustion chamber 11), to produce deposits (a product) 17 within the process gas nozzle 16 (referencing FIG. 5).

The detoxifying device 10 comprises: a detoxifying device main unit 12 that is provided with a combustion chamber 11 into which the exhaust gas that includes the toxic component, described above, that is, the process gas PG, is introduced; a main burner 13 that forms, within the combustion chamber 11, the flame that is required for detoxification; a pilot burner 14 for forming the pilot light PL that is necessary to ignite the main burner 13; the process gas nozzle 16 that is the gas passage for introducing the process gas PG into the combustion chamber 11; a scraper 18 as deposit removing means for removing the deposits 17, such as the aforementioned silica ($SiO_2$), or the like, that have been deposited on the inner wall, and the surroundings thereof, in the combustion chamber 11 (depicted in FIG. 5); a temperature sensor 19 for detecting the temperature within the combustion chamber 11; a device controller 20, as the controlling portion for controlling the overall operation of the device, and the like. Note that the device controller 20 is, for example, a computer, and includes a program for running the operations of the device as a whole through a predetermined process.

The detoxifying device main unit 12 has a first cylinder wall 21 that is substantially cylindrical, and a second cylinder wall 22 that, similarly, is substantially cylindrical, located on the outside of the first cylinder wall 21. The top face of the first cylinder wall 21 and the top face of the second cylinder wall 22 are both closed by a shared inlet head 23, with the bottom face side closed by a bottom wall 15, and these are connected, through an exhaust port (not shown) to an exhaust pipe of the factory equipment. Additionally, the interior space of the first cylinder wall 21 is configured as a combustion chamber 11, where the space portion between the first cylinder wall 21 and the second cylinder wall 22 is configured as a burner gas chamber 24 into which a flammable fuel 25 and air 26 are introduced. Note that the first cylinder wall 21 and the second cylinder wall 22 need not necessarily have round cylindrical shapes.

The main burner 13 for forming, within the combustion chamber 11, the flame that is required for detoxification has a first main burner 13A that is provided on the inner periphery of the burner gas chamber 24, and a second main burner 13B that is provided on the inlet head 23 that structures the top wall of the combustion chamber 11.

The base portion 23A of the inlet head 23 that forms the top face of the first cylinder wall 21 and the second cylinder wall 22 is formed in a disk shape that fits with the cylindrical shapes of the first cylinder wall 21 and the second cylinder wall 22, as illustrated in FIG. 2. The second main burner 13B, head scraper 18B, temperature sensor 19, and pilot burner 14 are attached to the base portion 23A of the inlet head 23.

As illustrated in FIG. 1, the first main burner 13A has a structure wherein a plurality of jet holes 21A is formed in the first cylinder wall 21 that structures the burner gas chamber 24, where a mixed gas 27 of a flammable fuel 25 and air 26 is expelled from the jet holes 21A toward the combustion chamber 11, enabling combustion. Consequently, a first flammable gas supplying nozzle 28 for supplying the flammable fuel 25 into the burner gas chamber 24, and a second flammable gas supplying nozzle 29 for supplying the air 26 into the burner gas chamber 24, are connected to the second cylinder wall 22.

Similarly, as illustrated in FIG. 1, the second main burner 13B has a process gas nozzle 16 as the gas passage for the process gas, for introducing the process gas PG into the combustion chamber 11. The process gas nozzle 16 is open as the gas introducing aperture outlet 16A in the base portion 23A of the inlet head 23, that is, the top face of the combustion chamber 11. Note that the process gas nozzle 16 inlet side is connected to the outlet side of the processing chamber of the semiconductor manufacturing equipment, not shown, that discharges the process gas PG. Given this, in the detoxifying device 10, the process gas PG that is sent from the processing chamber is introduced into the combustion chamber 11 from the process gas nozzle 16. Note that there is no particular limitation on the number of process gas nozzle 16, where, in the present example, this number is 4, as depicted in FIG. 2, disposed with substantially equal spacing around a reference circle C1 that surrounds the four process gas nozzles 16. Additionally, in the second main burner 13B, a third flammable gas supplying nozzle 30 is connected within the process gas nozzle 16, where the flammable fuel 25 and the oxygen (or air) 26 is supplied from the connected third flammable gas supplying nozzle 30 into the process gas nozzle 16. In addition, the structure is such that mixed gas 27 of the flammable fuel 25 and the oxygen (or air) 26 is expelled from the process gas nozzle 16 gas introducing aperture outlet 16A toward the combustion chamber 11, enabling combustion.

Figure 3:
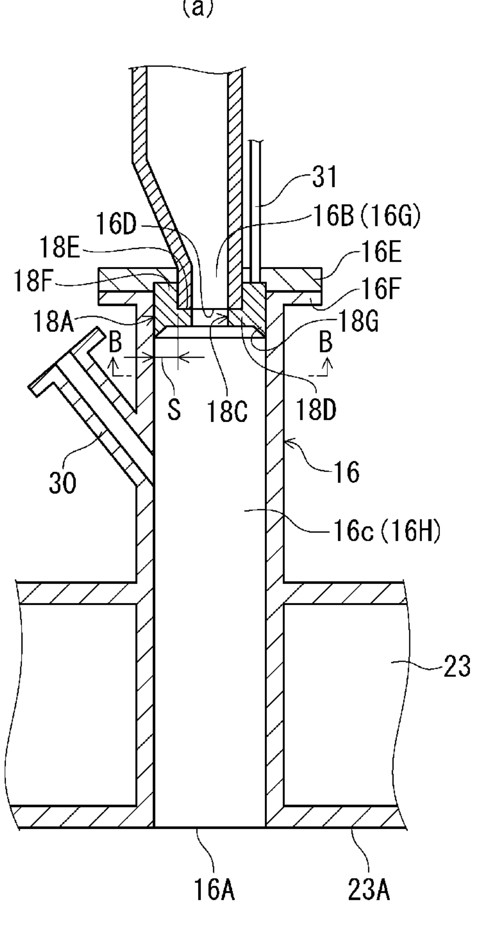
FIG. 3 is an enlarged diagram depicting the nozzle, indicated by reference symbol (N), and the surrounding structure in the aforementioned detoxifying device depicted in FIG. 1, where (a) is a cross-sectional drawing thereof and (b) is a cross-sectional view, in the direction of the arrow, of the section B-B in (a).
Figure 3:
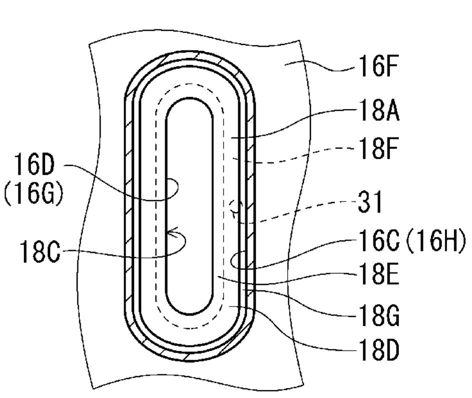

The process gas nozzle 16 is depicted also in FIG. 3 as a partial enlarged cross-sectional drawing of FIG. 1. FIG. 3 is an enlarged diagram depicting the process gas nozzle 16, indicated by reference symbol (N) in FIG. 1, and the surrounding structure, where (a) is a cross-sectional drawing, and (b) is a cross-sectional view, in the direction of the arrow, for the section B-B in (a). Adding FIG. 3 to FIG. 1 and FIG. 2 to explain the structure of the process gas nozzle 16 further, the process gas nozzle 16 comprises a first nozzle part 16G, having a narrow diameter portion 16B, and a second nozzle part 16H, having a wide diameter portion 16C, provided on the downstream side of the narrow diameter portion 16B of the first nozzle part 16G.

The narrow diameter portion 16B, as the first nozzle part 16G, is formed so that the opening diameter gradually becomes narrower toward the second nozzle part 16H side from the process chamber side, formed, for example, as an orifice tube, a Venturi tube, or the like. When the narrow diameter portion 16B is formed as an orifice tube, a Venturi tube, or the like, the detoxification efficiency is improved through mixing well the fuel and the oxygen for combustion through the sudden expansion at the discontinuity in the flow at the orifice part or the Venturi part. The gas introducing aperture outlet 16D of the narrow diameter portion 16B is connected securely to the wide diameter portion 16C through a flange 16F and a flange 16E on the narrow diameter portion 16B side, as depicted in FIG. 3(*a*). Note that the gas introducing aperture outlet 16D of the narrow diameter portion 16B passes vertically through the flange 16E to protrude a prescribed amount into the wide diameter portion 16C. The shape of the gas introducing aperture outlet 16D is formed elliptically, as depicted in FIG. 3(*b*).

On the other hand, in the wide diameter portion 16C, as the second nozzle part 16H, the flange 16F, on one end side (the top end side) is connected securely through the flange 16E to the gas introducing aperture outlet 16D of the narrow diameter portion 16B. As depicted in FIG. 3(*a*), the wide diameter portion 16C has an inner diameter that is larger than the outer diameter of the narrow diameter portion 16B so that a gap S from the gas introducing aperture outlet 16D of the narrow diameter portion 16B is formed around the entire periphery, and, as depicted in FIG. 3(*b*), the wide diameter portion 16C is formed in the shape of an ellipse, as was the narrow diameter portion 16B. Note that, as depicted in FIG. 3(*a*), the wide diameter portion 16C is formed in a tube shape that has a constant diameter from the one end side (the top end side) until the bottom end side, where the gas introducing aperture outlet 16A is provided, formed with an elliptical cross-sectional shape.

The pilot burner 14 has a pilot nozzle 14A, provided in the vicinity of the process gas nozzle 16. The structure is such that the outlet side of the nozzle 14A is open to the top face of the combustion chamber 11 (the base portion 23A), where mixed gas 27 of the flammable fuel 25 and the air (or oxygen) 26 is expelled from the outlet of the nozzle 14A toward the combustion chamber 11, enabling combustion. Note that the position of the nozzle 14A that is provided on the top face of the combustion chamber 11 is provided at a position that is further toward the inside of the reference circle C1 that surrounds the four gas introducing aperture outlets 16A within the combustion chamber 11, as depicted in FIG. 2.

The temperature sensor 19 is for measuring the temperature within the combustion chamber 11, and is formed in a pin-shape, attached to the inlet head 23 in a state wherein one end side protrudes into the combustion chamber 11. The position in the top face of the combustion chamber 11 at which the temperature sensor 19 is provided is a position that is further to the outside than the reference circle C1 that surrounds the four gas introducing aperture outlets 16A within the combustion chamber 11, and to the outside of a reference circle C2.

The scraper 18 has a nozzle scraper 18A for removing deposits 17 that are adhered within the nozzle (the process gas passage) 16 and expelling them from the gas introducing aperture outlets 16A into the combustion chamber 11, and a head scraper 18B for removing the deposits 17 that were adhered to the base portion (top face) 23A of the combustion chamber 11 and the deposits 17, and the like, that remain adhered to the bottom end of the nozzle scraper 18A.

Figure 4:
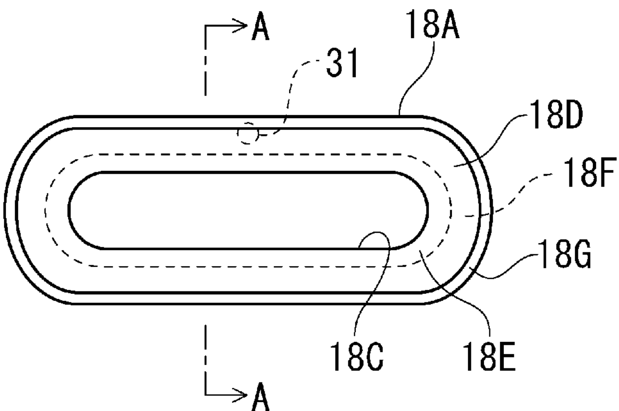
FIG. 4 depicts a nozzle scraper in the aforementioned detoxifying device, wherein (a) is a bottom view of the scraper, viewed from the combustion chamber side, and (b) is a cross-sectional view, in the direction of the arrow, of the section A-A in (a).
Figure 4:
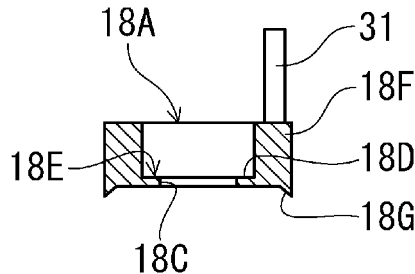

The nozzle scraper 18A is configured so as to undergo reciprocating movement in the vertical direction, within a prescribed movement range, within the wide diameter portion 16C of the process gas nozzle 16, where, during this movement, the deposits 17 that are adhered to the inner peripheral wall face of the wide diameter portion 16C are scraped off and expelled into the combustion chamber 11. As illustrated in FIG. 3 and FIG. 4, the nozzle scraper 18A is formed so that the outer shape of the main unit portion 18D is substantially equal to the inner diameter of the wide diameter portion 16C, and a through hole 18C, that passes through in the vertical direction and that is shaped, in the plan view, substantially identically with the gas introducing aperture outlet 16D of the narrow diameter portion 16B, is formed in the center of the main unit portion 18D, to form a ring shape. That is, an inside protruding part 18E is formed all the way around on the center side of the nozzle scraper 18A up to a position that covers the bottom end face of the narrow diameter portion 16B in the state wherein the nozzle scraper 18A has been moved to a "standby position" (the topmost position of the movement range), depicted in FIG. 3(*a*). Consequently, the main unit portion 18D of the nozzle scraper 18A functions as a protruding portion for covering the entirety of the top face of the wide diameter portion 16C in the state wherein it has been moved to the "standby position," depicted in FIG. 3(*a*).

Moreover, in the top face of the main unit portion 18D in the nozzle scraper 18A is provided a protruding portion 18F that is able to enter into the gap S between the outer periphery of the bottom end portion of the narrow diameter portion 16B and the inner periphery of the wide diameter portion 16C, in the "standby position," as depicted in FIG. 3(*a*). On the other hand, a scraping portion 18G is provided, as an edge-shaped blade that faces downward along the inner peripheral surface of the wide diameter portion 16C, in the bottom face side of the nozzle scraper 18A. When the nozzle scraper 18A moves into the "standby position," the protruding portion 18F in the nozzle scraper 18A enters into the gap S between the outer periphery of the bottom end portion of the narrow diameter portion 16B and the inner periphery of the wide diameter portion 16C, allowing a portion (the inside protruding part 18E) of the top face of the main unit portion 18D of the nozzle scraper 18A to contact the bottom face of the narrow diameter portion 16B.

In the scraping portion 18G of the nozzle scraper 18A, the outer peripheral side tip end part is formed in the shape of a sharp blade, and when the nozzle scraper 18A moves toward the downward direction from the "standby position," the deposits 17 that are adhered to the inner wall of the wide diameter portion 16C are scraped off toward the combustion chamber 11.

Additionally, a rod 31, for moving the nozzle scraper 18A in the vertical direction from the outside of the process gas nozzle 16, is provided on the top face of the main unit portion 18D in the nozzle scraper 18A. Note that the structure is such that the movement of the rod 31 in the vertical direction is run by operation of a driving portion 20A that has an electric motor (not shown) as the driving force, controlled by the device controller 20 that is depicted in FIG. 1(*b*). Additionally, when the nozzle scraper 18A is moved to the bottommost position by the rod 31, the scraping portion 18G on the bottom face side protrudes slightly, together with the deposits 17, into the combustion chamber 11.

The head scraper 18B is formed by a plate-shaped member, and is attached, so as to be able to rotate together with a rotatable shaft 33, to the bottom end side of the shaft 33, which passes through substantially the center of the inlet head 23. The head scraper 18B is attached in a state that rotates so as to slide substantially horizontally within the combustion chamber 11 and on the bottom face of the inlet head 23, that is, the base portion (the top face) 23A of the combustion chamber 11. The structure is such that the rotation of the shaft 33, that is, the rotation of the head scraper 18B, happens automatically through operation of the driving portion 20B that has, as its driving force, an electric motor (not shown) that is controlled by the device controller 20.

Figure 5:
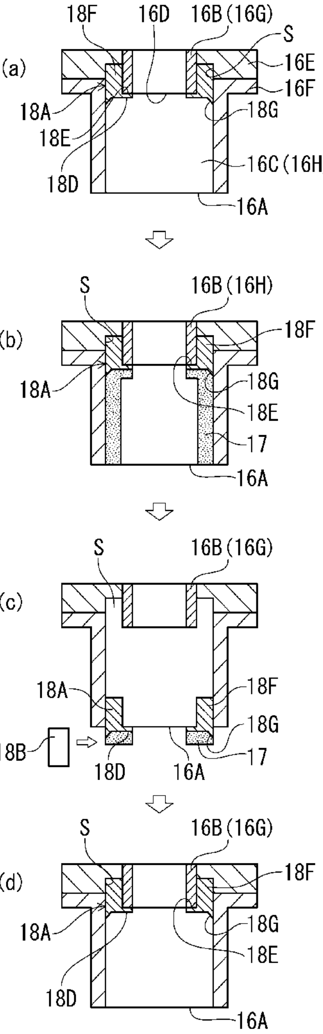
FIG. 5 is an explanatory diagram depicting schematically the operation of a nozzle scraper provided in the nozzle depicted in FIG. 4.

FIG. 5 is an operation explanatory diagram for removing the deposits 17 within the process gas nozzle 16 in the detoxifying device 10. The operation of the detoxifying device 10, depicted in FIG. 1 through FIG. 4, will be explained by adding the operation explanatory diagram of FIG. 5, in addition to FIG. 1 through FIG. 4. Note that for simplicity in the explanation, in FIG. 5 the process gas nozzle 16, the scraper 18, and the like are further simplified, where only the members requiring explanation are depicted schematically.

In the detoxifying device 10, when a device start signal is applied by the device controller 20, a pilot light PL is formed by the pilot burner 14 in the combustion chamber 11, as illustrated in FIG. 1. This pilot light PL is set so as to always be maintained in the lit state.

Moreover, the flammable fuel 25 is supplied from the first flammable gas supplying nozzle 28, and air 26 is supplied from the second flammable gas supplying nozzle 29 as well, to the first main burner 13A.

The flammable fuel 25 and the flammable gas (the air 26) that are supplied to the first main burner 13A become mixed gas 27, and are expelled from the first main burner 13A toward the combustion chamber 11. Additionally, the igniting effect by the pilot light PL is applied, at the pilot burner 14, to the mixed gas 27 that was expelled, to form, within the combustion chamber 11, the flame that is required to detoxify the process gas PG.

Note that in supplying the process gas PG to the combustion chamber 11, it is supplied together with the flammable gas (air or oxygen) from the third flammable gas supplying nozzle 30 after the flame is formed. Given this, this detoxifying device 10 converts the toxic gas into non-toxic gas through causing an oxidation reaction by combusting the process gas PG and reacting it with air (oxygen) in the combustion chamber 11. Following this, the process gas PG that has been detoxified by combustion or thermal decomposition by the flame is discharged, as a processed gas, to the outside of the detoxifying device main unit 12 from an outlet port, not shown, that is in communication with the combustion chamber 11.

Moreover, conversely, when a command signal for stopping combustion (thermal decomposition) is applied to the detoxifying device 10 from the device controller 20, the supplies of the flammable fuel 25 and air (or oxygen) 26 and 27, and of the process gas PG, and the like, from the first flammable gas supplying nozzle 28, the second flammable gas supplying nozzle 29, and the third flammable gas supplying nozzle 30 to the main burners 13 (13A and 13B) are all stopped. When this is done, the flame within the combustion chamber 11 goes out naturally. Given this, the combustion or thermal decomposition of the process gas PG by the flame within the combustion chamber 11 is stopped as well through the natural extinguishing of the flame.

Additionally, once the combustion or thermal decomposition of the process gas PG by the flame within the combustion chamber 11 has been ended, the device controller 20 drives the scraper 18, either periodically or as needed, to carry out an operation for removing the deposits 17 that are adhered within the nozzle (the gas passage) 16 and the deposits 17 that are adhered in the vicinity of the process gas nozzle 16 within the combustion chamber 11. The nozzle scraper 18A and the head scraper 18B are actuated in the operation for removing the deposits 17.

In removing the deposits 17 that are adhered and deposited within the nozzle (the gas passage) 16, the device controller 20 controls the driving of the driving portion 20A, and the driving portion 20A causes the nozzle scraper 18A to undergo reciprocating motion, within a prescribed range of movement, in the vertical direction (the direction of the gas passage) within the wide diameter portion 16C. Note that the nozzle scraper 18A, during the driving operation of the detoxifying device 10, is positioned at the "standby position," as depicted in FIG. 4(*a*) and FIG. 5(*a*), through the rod 31, under control by the device controller 20. Given this, the main unit portion 18D covers the top face of the wide diameter portion 16C and the peripheral edge part of the bottom face of the narrow diameter portion 16B that is provided with the gas introducing aperture outlet 16D.

When, accompanying driving operations of the detoxifying device 10, deposits 17 are deposited through adhering to the wide diameter portion 16C of the process gas nozzle 16, as depicted in FIG. 5(*b*), the device controller 20 moves the nozzle scraper 18A downward, by the rod 31, as depicted in FIG. 5(*c*). Through this downward movement of the nozzle scraper 18A, the scraping portion 18G moves downward while scraping off the deposits 17 that are deposited adhered to the inner peripheral surface of the wide diameter portion 16C, and the deposits 17 that have been scraped off are expelled through falling into the combustion chamber 11. Moreover, simultaneously the main unit portion (protruding portion) 18D moves the deposits 17, which were adhered and deposited on the top face part of the wide diameter portion 16C, downward, and at the bottommost movement position of the nozzle scraper 18A, the deposits 17 that have been moved together with the main unit portion 18D downward are, similarly, exposed within the combustion chamber 11 from the gas introducing aperture outlet 16D, as depicted in FIG. 5(*c*). That is, in the present example, the position depicted in FIG. 5(*c*) is the bottommost position.

Additionally, the device controller 20 causes the shaft 33 to be rotated by the driving portion 20B, causing the head scraper 18B to rotate horizontally together with the shaft 33. The horizontal rotation of the head scraper 18B rotates within the combustion chamber 11 so as to slide on the base portion (the top face) 23A of the inlet head 23, and the head scraper 18B scrapes off and removes the deposits 17 that are deposited adhered to the top face of the combustion chamber 11, and also scrapes off the deposits 17 that are adhered to the bottom end part of the nozzle scraper 18A that has been moved to the bottommost position, expelling them by causing them to fall into the combustion chamber 11. Note that even if the temperature sensor 19 is protruding, a contact avoiding portion 32 is provided in the head scraper 18B so that, during the rotation of the head scraper 18B, the temperature sensor 19 is avoided by the contact avoiding portion 32, enabling scraping of the deposits 17 to continue without interference with the temperature sensor 19.

Additionally, once removal of the deposits 17 by the head scraper 18B has been completed, the device controller 20 stops rotation of the head scraper 18B and also moves the nozzle scraper 18A from the bottommost position, depicted in FIG. 5(*c*), to the "standby position," which is the topmost position, depicted in FIG. 5(*d*). The operations for removing the deposits 17 by the nozzle scraper 18A and for removing the deposits 17 by the head scraper 18B are completed thereby.

Moreover, with the nozzle scraper 18A in the detoxifying device 10 according to the present example, a portion (the inside protruding part 18E) of the top face of the main unit portion (the protruding portion) 18D is formed as a protruding portion so as to contact the bottom face of the narrow diameter portion 16B when the nozzle scraper 18A is in the "standby position," making it possible to expel and remove, all at once, the deposits 17 that are deposited adhered over the entirety of the inner surface of the wide diameter portion 16C when scraping off through the nozzle scraper 18A.

Figure 6:
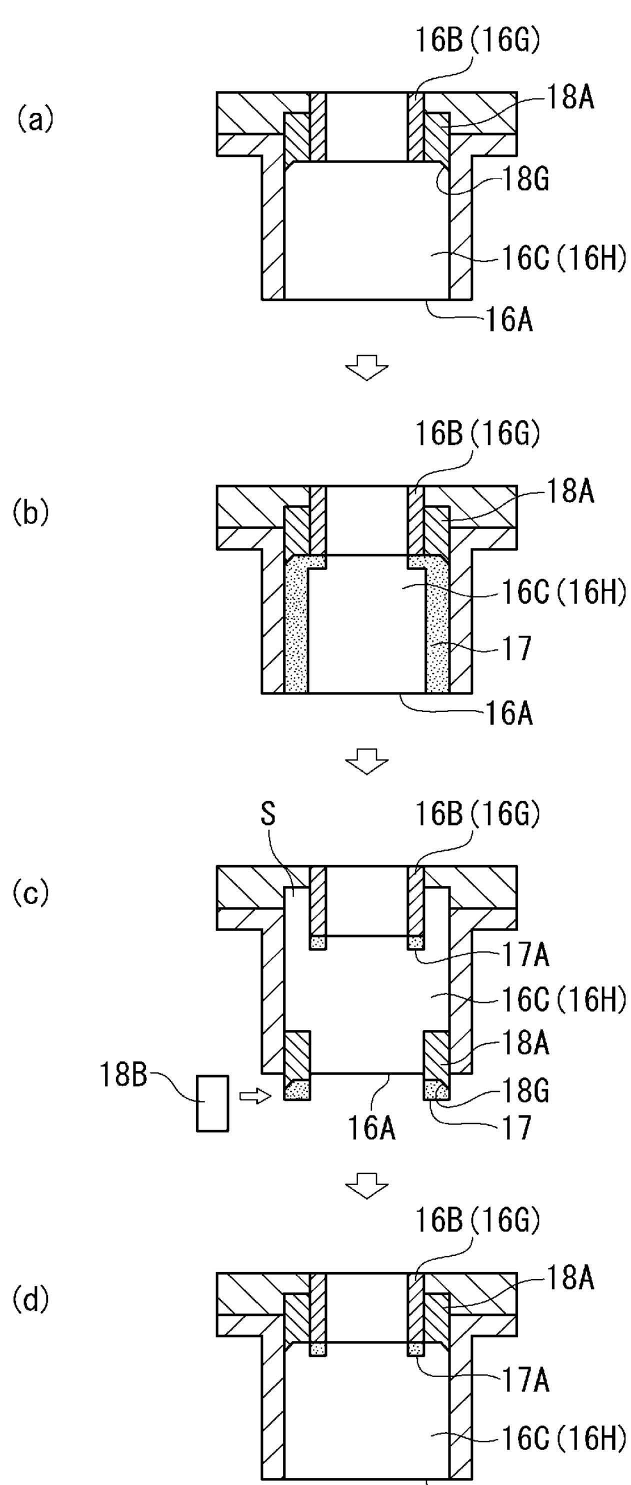
FIG. 6 is an operation explanatory diagram for explaining the effects of the aforementioned detoxifying device according to the present disclosure.

This will be explained further by comparing to the case of a structure wherein the top face of the main unit portion (protruding portion) 18D does not cover the bottom face of the narrow diameter portion 16B, as illustrated in FIG. 6. As illustrated in FIG. 6, when the top face of the main unit portion (the protruding portion) 18D does not cover the bottom face of the narrow diameter portion 16B, a portion of the deposits 17 (residual deposits 17A) will remain on the bottom face of the narrow diameter portion 16B where the gas introducing aperture outlet 16D is provided, as depicted in FIG. 6(*c*), when the nozzle scraper 18A moves to the bottommost position from the "standby position" of FIGS. 6(*a*) and (*b*). This will remain even after the nozzle scraper 18A has returned from the bottommost position to the "standby position" that is illustrated in FIG. 6(*d*). In contrast, with the structure of the present example, the main unit portion 18D is formed so that a portion (the inside protruding part 18E) of the top face of the main unit portion (protruding portion) 18D of the scraper 18A will contact the bottom face of the narrow diameter portion 16B with the nozzle scraper 18A at the "standby position," enabling all of the deposits 17 that are adhered over the entire surface of the wide diameter portion 16C to be expelled and removed, without residual, when scraped off by the nozzle scraper 18A. This makes it possible to shorten the maintenance time, and to anticipate an improvement in productivity.

The main unit portion 18D is formed so that a portion (the inside protruding part 18E) of the main unit portion (protruding portion) 18D of the nozzle scraper 18A will contact and cover the bottom face of the narrow diameter portion 16B with the nozzle scraper 18A in the "standby position." Through this, the deposits 17 that are directed toward the bottom face of the narrow diameter portion 16B within the wide diameter portion 16C will not adhere to the bottom face of the narrow diameter portion 16B, but will adhere to the portion (the inside protruding part 18E) of the top face of the main unit portion 18D, enabling prevention of direct adhesion of deposits 17 (residual deposits 17A) on the bottom face of the narrow diameter portion 16B wherein the gas introducing aperture outlet 16D is provided.

Moreover, because, in the present example, the movement of the nozzle scraper 18A is up/down movement, this enables processing by expelling the deposits 17 within the wide diameter portion 16C smoothly into the combustion chamber 11 even if the cross-sectional shape of the wide diameter portion 16C is rectangular, substantially square, elliptical, or the like, rather than being limited to circular.

Furthermore, the nozzle scraper 18A moves up and down within the wide diameter portion 16C that is provided further to the downstream side than the narrow diameter portion 16B, enabling easy application even in cases wherein, for example, an orifice, Venturi tube, or the like, is used wherein a narrow diameter portion 16B, and a wide diameter portion 16C that is further to the downstream side than the narrow diameter portion 16B, are provided.

Note that the present disclosure may be modified or combined in a variety of ways without deviating from the spirit or intent thereof, and obviously the present disclosure extends to these modifications and combinations.

Moreover, the present disclosure is not limited to a process gas nozzle 16 of a detoxifying device 10, but rather may be applied also to other exhaust gas pipes wherein detoxifying devices 10 are used in other parts.

The invention claimed is:

1. A detoxifying device for detoxifying, through combustion or thermal decomposition within a combustion chamber, a process gas that includes a toxic component, comprising:

a nozzle that comprises a narrow diameter portion and a wide diameter portion that is provided further to the downstream side than the narrow diameter portion, said nozzle connected to the top face of the combustion chamber, for introducing the process gas into the combustion chamber;

a nozzle scraper that is able to move upward and downward within a prescribed movement range within the wide diameter portion, to remove deposits adhered within the wide diameter portion; and a head scraper for removing the deposits that are adhered to a lower portion of the nozzle scraper, at the bottommost position of the range of movement thereof, wherein:

the nozzle scraper has:

a scraping portion for removing the deposits that are adhered to the inner wall of the wide diameter portion; and a protruding portion that is provided at the bottom end of the narrow diameter portion at the topmost position of the movement range.

2. A detoxifying device as set forth in claim 1, wherein:

a portion of the protruding portion covers the bottom face of the narrow diameter portion in the standby position wherein the nozzle scraper is stopped.

3. A detoxifying device as set forth in claim 1, wherein:

the head scraper is structured from a plate-shaped member, and is provided so as to enable horizontal rotation, facing the top face within the combustion chamber.

4. A detoxifying device as set forth in claim 1, further comprising a controlling portion for controlling driving of the nozzle scraper and the head scraper.

5. A detoxifying device as set forth in claim 4, wherein:

the controlling portion drives the head scraper to remove the deposits that are adhered to a lower portion of the nozzle scraper when the nozzle scraper is at the bottommost position of the movement range.

* * * * *